(12) United States Patent
Hansen

(10) Patent No.: US 6,828,695 B1
(45) Date of Patent: Dec. 7, 2004

(54) SYSTEM, APPARATUS AND METHOD FOR ENERGY DISTRIBUTION MONITORING AND CONTROL AND INFORMATION TRANSMISSION

(75) Inventor: Rick L. Hansen, 10920 E. Sprague, Spokane, WA (US) 99206

(73) Assignee: Rick L. Hansen, Veradale, WA (US)

( * ) Notice: Subject to any disclaimer, the term of this patent is extended or adjusted under 35 U.S.C. 154(b) by 0 days.

(21) Appl. No.: 10/119,977

(22) Filed: Apr. 8, 2002

Related U.S. Application Data (60) Provisional application No. 60/331,425, filed on Nov. 15, 2001, and provisional application No. 60/282,718, filed on Apr. 9, 2001.

(51) Int. Cl.[7] .............................. H02J 1/00; H02J 3/00
(52) U.S. Cl. .......................................... 307/31; 307/39
(58) Field of Search .............................. 307/11, 31, 35, 307/38, 39

(56) References Cited

U.S. PATENT DOCUMENTS

| | | | | |
|---|---|---|---|---|
| 4,240,030 A | * | 12/1980 | Bateman et al. | 324/110 |
| 4,247,786 A | * | 1/1981 | Hedges | 307/35 |
| 4,301,444 A | * | 11/1981 | Bruckert et al. | 340/870.02 |
| 4,324,987 A | * | 4/1982 | Sullivan et al. | 307/35 |
| 4,350,980 A | * | 9/1982 | Ward | 340/870.02 |
| 4,471,232 A | * | 9/1984 | Peddie et al. | 307/35 |
| 5,699,051 A | * | 12/1997 | Billig et al. | 340/657 |
| 6,150,955 A | * | 11/2000 | Tracy et al. | 340/870.02 |
| 6,181,985 B1 | * | 1/2001 | O'Donnell et al. | 700/295 |
| 6,400,103 B1 | * | 6/2002 | Adamson | 315/292 |
| 6,553,353 B1 | * | 4/2003 | Littlejohn | 705/42 |

* cited by examiner

*Primary Examiner*—Gregory J. Toatley, Jr.
(74) *Attorney, Agent, or Firm*—Robert B. Hughes; Hughes Law Firm, PLLC

(57) ABSTRACT

A system by which an electric power utility can selectively limit power supplied to homeowners or other users to conserve electricity in periods of higher usage/shortages. Each home that is participating in the system has "smart switches" installed at outlet locations, for example, a stove, clothes dryer, television sets, lamp, etc. The power utility sends communications either through cell phone technology, telephone, or other communication link to the home to signal the various smart switches to limit electrical output (either blocking current flow totally, or periodically). The electric utility sends its communication to a monitoring and control computer which in turn controls the various smart switches. Also, information of power usage is transmitted to the smart switches back to the utility company so that bills can be prepared, with savings also specified in the bill.

20 Claims, 4 Drawing Sheets

SYSTEM, APPARATUS AND METHOD FOR ENERGY DISTRIBUTION MONITORING AND CONTROL AND INFORMATION TRANSMISSION

CROSS REFERENCE TO RELATED APPLICATIONS

The present invention claims the priority date of U.S. Provisional Application Ser. No. 60/282,718, filed Apr. 9, 2001 and also claims the benefit of the priority date of U.S. Provisional Application No. 60/331,425, filed Nov. 15, 2001.

BACKGROUND OF THE INVENTION a) Field of the Invention

The present invention relates to the control and monitoring of energy distribution, and more particularly to the distribution of electrical power to end users, such as homes, buildings, manufacturing facilities, etc.

b) Background of the Invention

One of the current challenges in our society is the proper management and distribution of power, and particularly electrical power. For example, there are peak power periods during which greater electrical energy is used on a daily basis. Further, there are other periods where the availability of power does not match the rate at which the electrical power is being used by the consumers, so that it exceeds the ability to meet the demand at that particular time. In those instances, the controlling agency or power company may issue requests to the consumers to reduce or limit their consumption of energy in certain areas of use, particularly the high energy uses, such as air conditioning systems, heating systems, high energy consumption appliances (e.g. stoves, dryers, hot water tanks, etc.). However, one of the problems is that the power reduction programs are done in more of an emergency basis.

Accordingly, there has been a long felt need to have a more effective system which is "user friendly", more predictable, and yet effective in monitoring and controlling the distribution of power in a manner that is least disruptive to the day to day requirements of the consumers and yet accomplishes significant reductions in power consumption.

In addition, while the power company is forced to increase power price as a result of supply and demand, it would be desirable for the power company to be able to notify the consumer of the increase and letting them know the cost of power at this given period of time as well as what it will be for a given period of time in the future during peak periods.

Accordingly, it is an object of the present invention to provide such a system, apparatus and method for accomplishing these objectives.

SUMMARY OF THE INVENTION

One of the advantages of the present invention is that it is readily able to be conveniently implemented in an existing a power utility network. In such a power utility network, there is the power provider, which could be an electric utility company, or some other provider of electricity, or possibly a provider of some other type of power. This power provider serves a number of power user facilities, which includes households, but also would include other power users. These power users which enlist in the system of the present invention are designated broadly as "participating power user facilities".

Each of these power user facilities has a facility power distribution network which in a household can simply be the conventional wiring in the household. Thus, there would be a main power receiving connection to receive power from the power provider, and this would normally be the location where the power meter is located for an electrical distribution system. The electricity flows through a power network to various outlet locations where there is usually a socket outlet or other device to make an electrical connection.

At least some of these power outlets (or probably most of these power outlets) are connected to one or more power-using components, which would be connected generally to either a 220-volt line or a 110-volt line. The 220-volt line would generally serve a hot water heater or home appliances such as an electric stove or a clothes dryer. Most of the remaining power-using components, such as a refrigerator, television set, a microwave, a lamp, or a variety of other electric-using components, such as a toaster, a mixer, etc., would connect to a 110-volt outlet.

In the system of the present invention, each of the participating facilities has a plurality of monitoring/switching units, each of which has an operative connection to the power distribution network for a related outlet location of the network. Each such monitoring/switching unit is arranged to receive control signals to stop current flow or permit current flow from its related outlet location. Each monitoring/switching unit also is arranged to monitor voltage and current flow from its related outlet location and to provide information signal(s) related to the voltage and current flow.

Each of the facilities also has a facilities monitoring/control section which has operative connections to each of the monitoring/switching units of that facilities and is arranged to transmit said control signal(s) to said monitoring/switching units to stop current flow and permit current flow, and to receive said information signal(s) from the monitoring/switching units.

There is a power provider control section arranged to transmit provider control signals to the monitoring/control section of each facility to selectively stop current flow or permit current flow at one or more selected outlet locations.

In a preferred form, the power provider control section and the facility monitoring/control section transmit and receive signal(s) between one another by way of electromagnetic wave communication, such as cell-phone, paging fiber optic or Ethernet technologies, telephone communication, or a combination of electromagnetic wave communication and telephone communication. Also, in the preferred form, the monitoring/switching units and the facility monitoring/control section send and receive signal(s) between one another by communicating over the power distribution network of the facility. However, it would be possible to use electromagnetic communication, as mentioned in the preceding paragraph.

Other features of the present invention will become apparent from the following detailed descriptions.

BRIEF DESCRIPTION OF THE DRAWINGS

At FIGS. 3, 4 and 5 are also schematic drawings of a third embodiment of the present invention.

DETAILED DESCRIPTION OF THE PREFERRED EMBODIMENT

Figure 1:
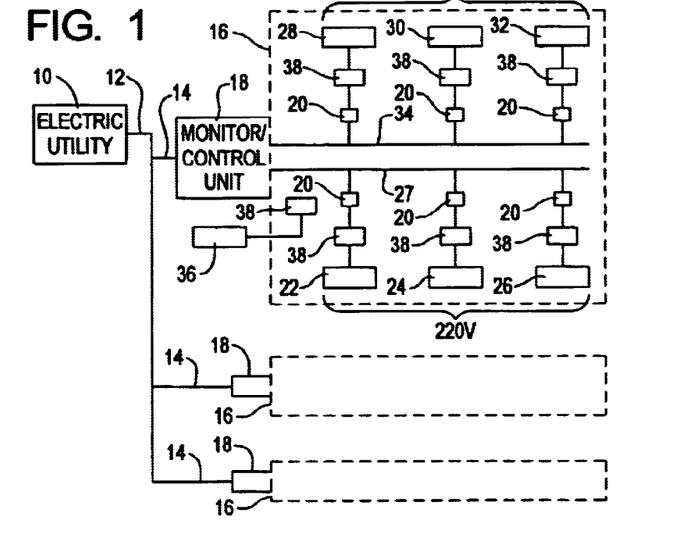
FIG. 1 is a schematic drawing showing a first embodiment of the system of the present invention.

Reference is first made to a somewhat simplified schematic drawing entitled FIG. 1, which shows a first embodiment of the system of the present invention. There is shown in FIG. 1 the electric power utility company 10 which distributes its power through main distribution lines 12 and then through branch distribution lines indicated at 14 to end users, which in this instance will simply be considered as home owners. In FIG. 1 there are shown the three homes 16, each presented in the form of a rectangular figure drawn in broken lines. Normally, there will be for each home 16 an electric meter which records the use of power, and this meter is periodically read by an employee of the electric company who visits the home and reads the meter, after which a bill is sent to the home owner.

In this first embodiment of the present invention, there is provided in place of this power meter a monitoring/control unit 18 of the present invention.

The home 16 indicated schematically at the top of FIG. 1 is shown in more detail and has several outlets 20 where electrical energy is consumed. There are shown schematically various power using components, such as a hot water heater 22, an electric stove 24, and an electric clothes dryer 26. Each of these will generally draw a current at 220 volts from the line 27. Then there is also shown, for example, a deep freezer 28, a television 30, and an air pump 32 that in turn pumps air into a fish tank to keep the fish contained therein healthy and alive. These are connected through outlets 20 to a 110 volt line 34. Finally there is a well water pump 36 located outside of the home and connected to the 220 volt line 27. The other two houses 16 in FIG. 1 have a similar electric power network and power using components.

At the location of each outlet 20 there is provided at 38 a monitoring/switching unit which utilizes a customized X-10 protocol technology. Each unit 38 is able to respond to an appropriate electrical/electronic signal (which can be a digital signal) to perform certain functions. The unit 38 includes apparatus that functions as a switch to block the flow of current at the outlet, or permit such flow. Each unit 38 can be substituted for the conventional socket outlet 20, or be configured to have an operative connection to the existing outlet 20. Each unit 38 both controls current flow and also monitors the current and voltage. Each monitoring/control unit 18 can be programmed to meet the specific requirements which are prearranged with the home owner.

To place this in a practical context, let us assume that one of the major objectives is to monitor and control the electric power delivered to each home 20 during a critical period. The home owner and the electric power company would agree in advance that during such periods the electric company could curtail for a period of time the delivery of power in the home to certain outlets which could be inoperative for a period of time without substantial inconvenience. Then when a critical power distribution period comes, the appropriate control signals would be sent from the electric power company 10 to each home (facility) through the monitor/control unit 18 in accordance with this prearranged agreement. The signal could be sent over a phone line or as an electromagnetic wave, such as by cell-phone, paging, fiber optics, or Ethernet technologies.

For example, the power could be shut off to all of the appliances that use 220-volts for a reasonable period of time without causing substantial inconvenience. However, if the power shortage occurs during a very critical time where the outside temperature is extremely low, then the unit 38 would not, for example, shut off power to the outside well pump 36 which would need to keep operative so that it does not freeze up. Also, it may be that some 110-volt outlets, such as the outlet 32 which operates a pump to keep the fish in the fish tank healthy, may be considered sufficiently critical so that there would not be shut off. Further, if one of the outlets keep a deep freeze functioning and there was a large amount of food therein, then it may be desired that this not be shut down for too long of a period. Also, some of the outlets to selected lights or a microwave oven could remain operative.

To accomplish this, the monitoring/control unit 18 would receive the proper signal from the electric company or electric utility 10 to put the conservation program into operation, and the monitor/control unit 18 would deliver the appropriate signals to each of the control/switching units 38 to either leave the switch closed so as to deliver power or to open the switch to interrupt power to the selected outlet.

In addition to the features described above, there will now be described further details of the system. First, the monitor/switching unit 38 provided for each of the outlets is designed and arranged to perform an additional function of monitoring the flow of electricity to the various outlets with regard to the amperage, voltage, and time during which the electricity is used. The unit 38 further has the capacity to transmit this information either on a continuous basis, semi-continuous basis or periodically back to the monitor control unit 18 which in turn is able to further process and/or collect such data and transmit this back to the electric company 10. Further, when there is a critical period for power distribution and conservation is of benefit to the distribution system, the various units 38 which are operatively connected to the outlets that still have power available could send data back to its related monitor/control unit 18 of the use of the electricity by that outlet. This data could be accumulated, for example, as a bonus to that particular home owner (or other power user) for that contribution of energy conservation during the critical period made by not using the outlet where power is available.

Further, with this data being transmitted to the power company, the company could in turn calculate the billing in accordance with the data received and periodically send a report and/or bill to the consumer. Further, this bill could be itemized relative to the areas of power usage so that the home owner (or other user) could monitor his/her use of the power by way of further voluntary savings on consumption of electricity. It is to be understood that the electric company would have a computer system to perform all of these functions.

Yet another added feature would be that in addition to transmitting the billing and/or power usage information to the consumer, there could also be arrangements with other companies which sends bills, such as a telephone company, credit card companies, stores, banks where payments are due, etc. as an alternative to using the mail. With this communication link in place, it would also be possible for the home resident to electronically pay these bills through the same network which is with the power company. Also, with this same communication link in place, other sensors could be placed in the home, such as smoke alarms (for fire), security sensors which are set to detect unwanted intrusions into the household, sensors attached or somehow operatively connected to a person to monitor critical health conditions, such as coronary malfunctions. It is obvious that various modifications and additions could be made to the present invention.

Additionally, the power company could use this invention to establish "pre-paid" power usage or "Consumer Power Credits" (CPC) whereby, the consumer could prepay for certain amount of power at a given prices. The consumer then could monitor power consumption as well as amount of power remaining through the monitor/control unit.

Figure 2:
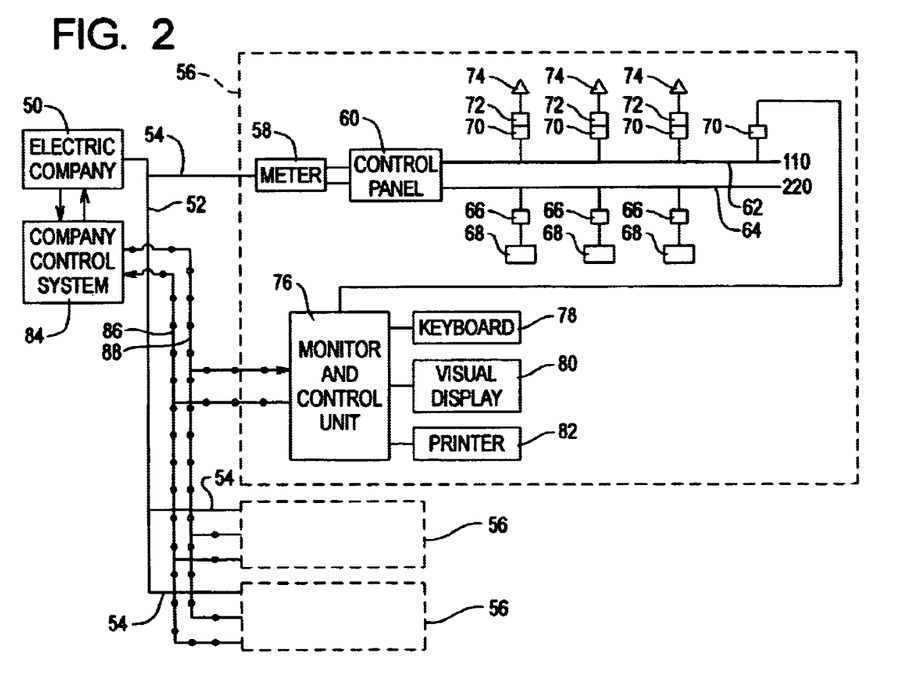
FIG. 2 is a schematic drawing similar to FIG. 1 but showing a second embodiment of the system of the present invention.

A second embodiment of the present invention is shown in FIG. 2. There is an electric power company (utility) 50 which distributes power through main lines 52 and through branch lines 54 to a number of power users. In FIG. 2, these are shown, by way of example, three homes 56. The home indicated at 56 at the top part of FIG. 2 shows the components of the present invention, and it is understood that the other two homes, indicated simply as rectangular dotted lines, would also have the components of the present invention therein.

In each home 56 there is a conventional meter 58 which measure power from the branch line 54 with the power being transmitted to the control panel 60. The control panel 60 has the usual circuit breakers and it supplies power through electric wires in the house through 110-volt lines and 220-volt lines designated 62 and 64, respectively. The 220-volt line(s) connects to a number of 220-volt outlets 66 which are not conventional outlets, but are monitoring/switching units 66 (the same as, or similar to, the monitoring/switching units 38), that are specially provided in the present invention and which take the place of the conventional 220 volt outlet. These special outlets 66 in turn connect to the major appliances which use 220-volts, such as a clothes dryer, a stove, a hot water heater, an air conditioner, etc., these being collectively given the identifying number 68. Then the 110-volt line 62, has by way of example, a number of conventional outlets 70.

The components 50–70 discussed thus far (except for the units 66) already exist in the prior art and are (or may be) of conventional design. As will be disclosed further in the following text, one of the advantages of this embodiment of FIG. 2 is that little or no modification is required to the existing electrical power distribution system in the house. The meter 58 can remain as a conventional meter which measures power going into the house, and also provides a readout so that the monthly or bimonthly power bill could be sent out. The control panel is a conventional control panel with a number of circuit breakers that function in the conventional way. The 110 volt outlets 70 can be the ordinary socket outlets that are found in a household.

Now the "smart switches" 66 (i.e. monitoring/switching units) and the other additional components of the present invention which are added to this existing prior art electric network in the home will be described. First, there is a plurality of additional "smart switches" 72 (which are, or may be, the same as, or similar to, the monitoring/switching units 38 of FIG. 1) which are plugged into the various existing 110-volt outlets 70. Each of these "smart switches" in turn has a socket connection to which the plugs of the various power user components, such as lamps, microwaves, a deep freezer, a television, etc. Three of these power user components are shown as connected to the related smart switch outlet 72.

Then, as indicated above, there are smart switches 66 (i.e. monitoring/switching units) at the locations that are connected to the 220-volt line 64. As indicated previously, the smart switches for the appliances 68 are substituted for the prior art 220-volt outlets, but alternatively, these smart switches could be simply plugged into the existing 220-volt plug connection as it is. In this text, the term "smart switches" will be meant to include the substitute switches 66 and the add-on switches 72, with the understanding that all the smart switches could be "add-ons". Each of these smart switches 66 and 72 function as a socket to receive the plug from the appliance, lamp, television set, etc.

The second embodiment of the present invention further comprises a monitor and control section 76, and this section 76 has operative connections to the following three components, namely a keyboard 78, a visual display 80, and a printer 82.

There is a master control system 84 (i.e. the "company control system" of FIG. 2) which serves the same geographical area as does the power company 50. This system 84 has a "cell-phone, paging, fiber optics, and/or Ethernet technology" communication link by which the company control system transmits information and commands by electromagnetic waves to the monitor and control unit 76 of the various homes or buildings and in turn receives information from the monitor and control unit 76, these two communication links being indicated, respectively, by the lines 86 & 88 which have small circles along the lengths thereof. It can be seen that the power connections 52/54 and electromagnetic communication links 86 & 88 are also made to the other two homes 56 shown in FIG. 2.

All of the various functions which were performed by the present invention as described in the first embodiment are also performed by the second embodiment shown in FIG. 2. However, these are accomplished in a somewhat different manner. To illustrate this, let us assume that there is a peak power use period and the electric company wishes to shut down certain power use outlets in the various homes 56 in accordance with a previously arranged schedule. In the prior embodiment, the communication from the electric company is sent through the cell-phone link to the monitor and control unit 18 and through the control panel to the various smart switches to control the flow of current through these outputs.

In the system of FIG. 2, these commands are transmitted from the company control system through the cell-phone technology (i.e. electromagnetic waves) to the monitor and control unit 76. Then the monitor and control unit translates the signals from the company control system 84 into control signals that travel through the electric lines in the house 56 to the various "smart switches" 72 & 66. As described previously in the first embodiment, each of these smart switches 72 & 66 has its own particular address (i.e. identification designation) and each of the "smart switches" 72 & 66 respond when their address is associated with a command signal.

The keyboard 78 can have various functions. For example, the resident of the home may wish to modify the program by which Its power controlled. The keyboard could accomplish this directly by entering this into the monitor and control unit which would transmit this information back to the company control system which would make the change in the program. Alternatively, the keyboard could actually make the change in the program at the monitor and control unit 76 and this would be simply communicated through the cell-phone link back to the company control system so that its records would be corrected.

As indicated previously, the person may want to request information through the monitor and control unit 76, and this would be done by the keyboard 78. Also, the person may want to pay bills through the monitor and control unit 76 (as described previously herein). Further, in paying the bills, as soon as the bill is paid electromagnetically through the monitor and control unit 76, a receipt could be returned to the home resident by being printed on the printer 82. The visual display 80 could be a conventional CRT display unit or LCD display unit, and this could be used to provide information to the home resident. A further function of the visual display 80 would be to send information in a timely manner, and this could be augmented by an audio output or some other signal, such as a flashing red light. For example, there could be the onset of a period during which the billing rate for power was going to a higher level because of moving into a higher use period. This could be signaled to the home resident through an audible signal or a red flashing light or the like, as well as being displayed on the screen. The benefit of this is that it would give the home resident warning before the fact, as opposed to simply billing the home resident after the higher rate period has passed. Also red, yellow, and green lights could be used to give indications of a) critical power situation, b) a semi-critical power situation, or c) a non-critical power situation (i.e. an "ok" indication, so that remedial action could be taken by the customer).

As indicated previously herein, the second embodiment has a number of basic advantages. One of the these is that the system can be incorporated in a typical household without any change (or very little change) to the existing electric system. It may be that the person wants all of its high power usage appliances tied into this system, and this could be done rather simply by placing an adapter with the smart switch therein directly into the existing 220-volt outlet, or quickly making a certain substitution (i.e. the outlet 66). It may be that there are only certain 110-volt outlets 70 which the person feels would be worthwhile to be entered into this system, while there may be other outlets where the "smart switch" is not needed. The example of this would be where the outlet feeds an air pump to the fish tank, and the home resident does not want this air supply interrupted. Or it may be that some plug outlets 70 are used so seldom that it is not worth the trouble. The monitor and control unit 76 does not need any special connection and simply is plugged into an available plug power outlet 70. Thus, the monitor and control unit 76 can communicate through the power lines to all of these smart switches 72 & 66.

Now let us assume that the person had the system of this FIG. 2 installed in the home, but at a later time decided to stop any further use of the system. The person would simply need to unplug the monitor and control unit from its outlet 70, and all communication to and from the company control system 84 would cease, The smart switches 72 & 66 would remain closed, and they would simply function as conventional power outlets as they did before the system was installed. However, with the basic system of the meter 58 and control panel 60 still functioning, the person in the household would receive power in the regular manner.

The monitoring and control unit 76 serves the function of a transceiver (both sending and receiving signals), that serves a number of other functions. For example, in addition to obtaining the information about when each power use outlet is using current, there could be various control functions such as timing the periods when particular smart switches are on or off, or it could be programmed for other situations which might relate to that particular household.

Further, the information which is sent back to the power company could be used in a wide variety of ways to assist in future planning to optimize the use of the power. Further, there is a possibility that someone might want to bypass the system and "hotwire" some of the outlets, thus bypassing the smart switch. However, the total power that is reported from the individual user units could be compared with the total power reading to determine that the possibility of this happening.

The printer is such that it offers a modular approach for ease of use and simple installation for the user. The printer used to print the bill and receipt is designed to "clip in" to the monitor and control unit where the paper, ribbon and/or thermal print head are already in place, thereby needing no special assistance by the end user to install.

Various modifications could be made without departing from the basic teachings of the present invention.

Figure 3:
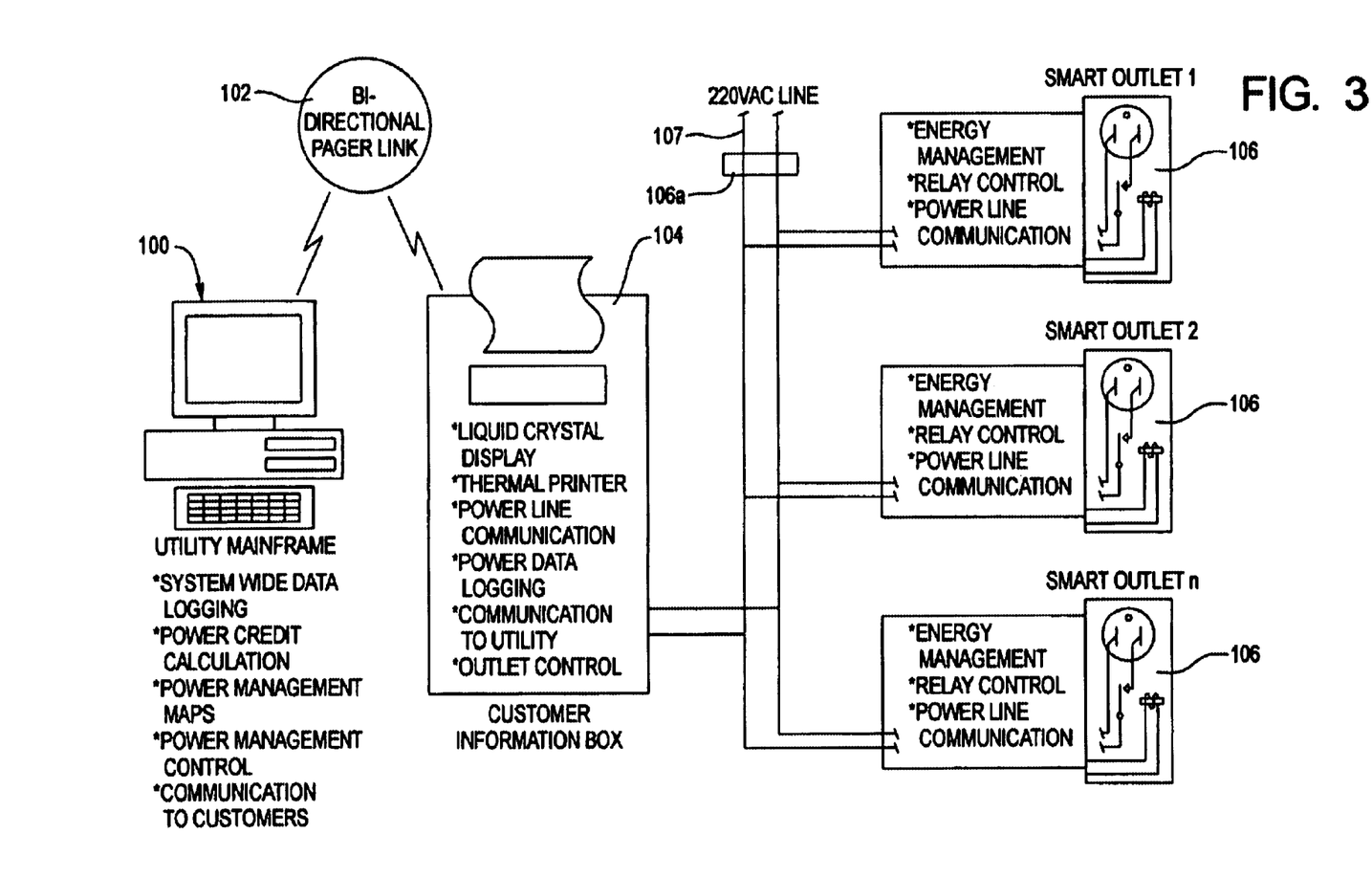
FIG. 3 discloses the overall system.
Figure 4:
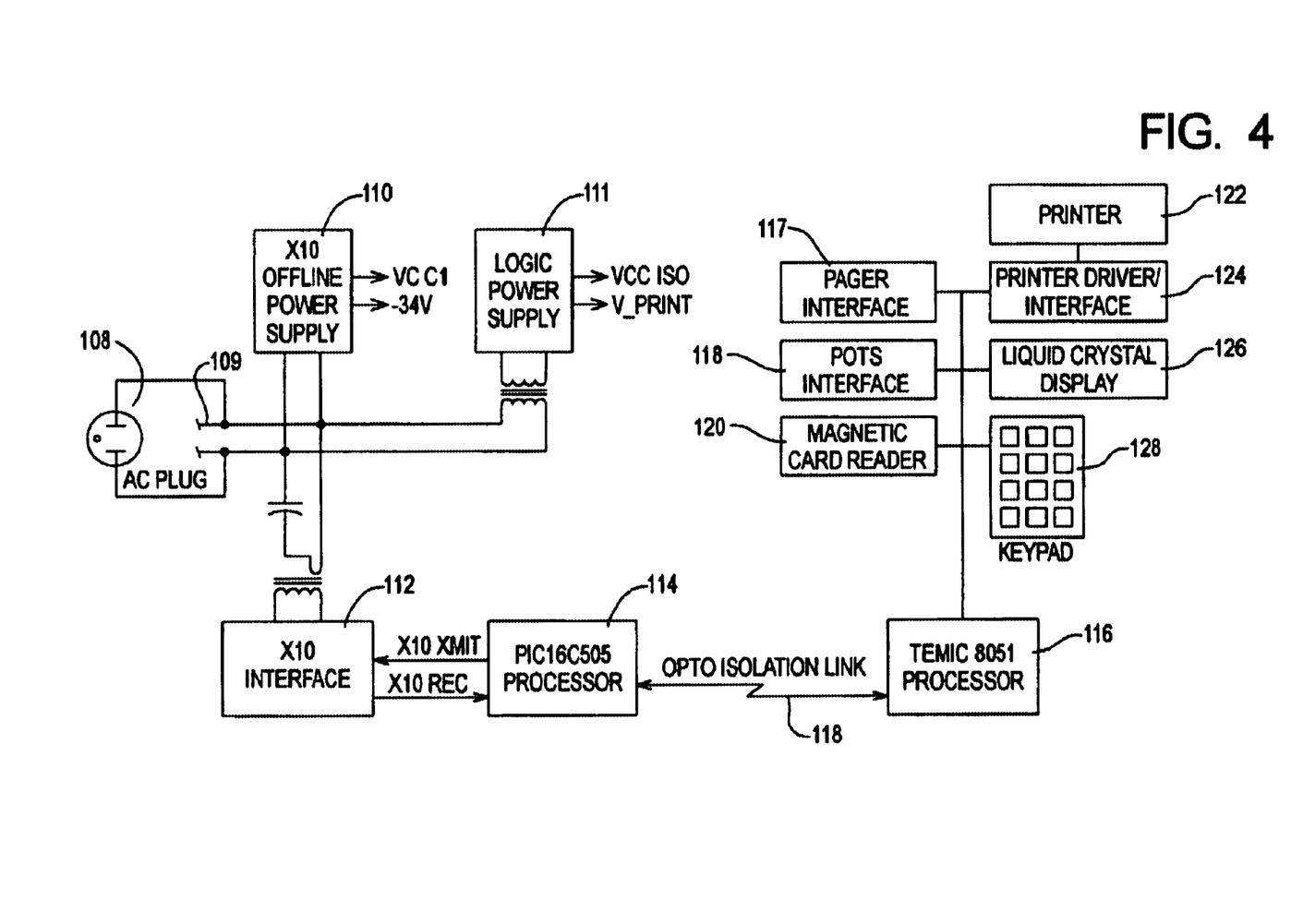
FIG. 4 discloses the customer information box.
Figure 5:
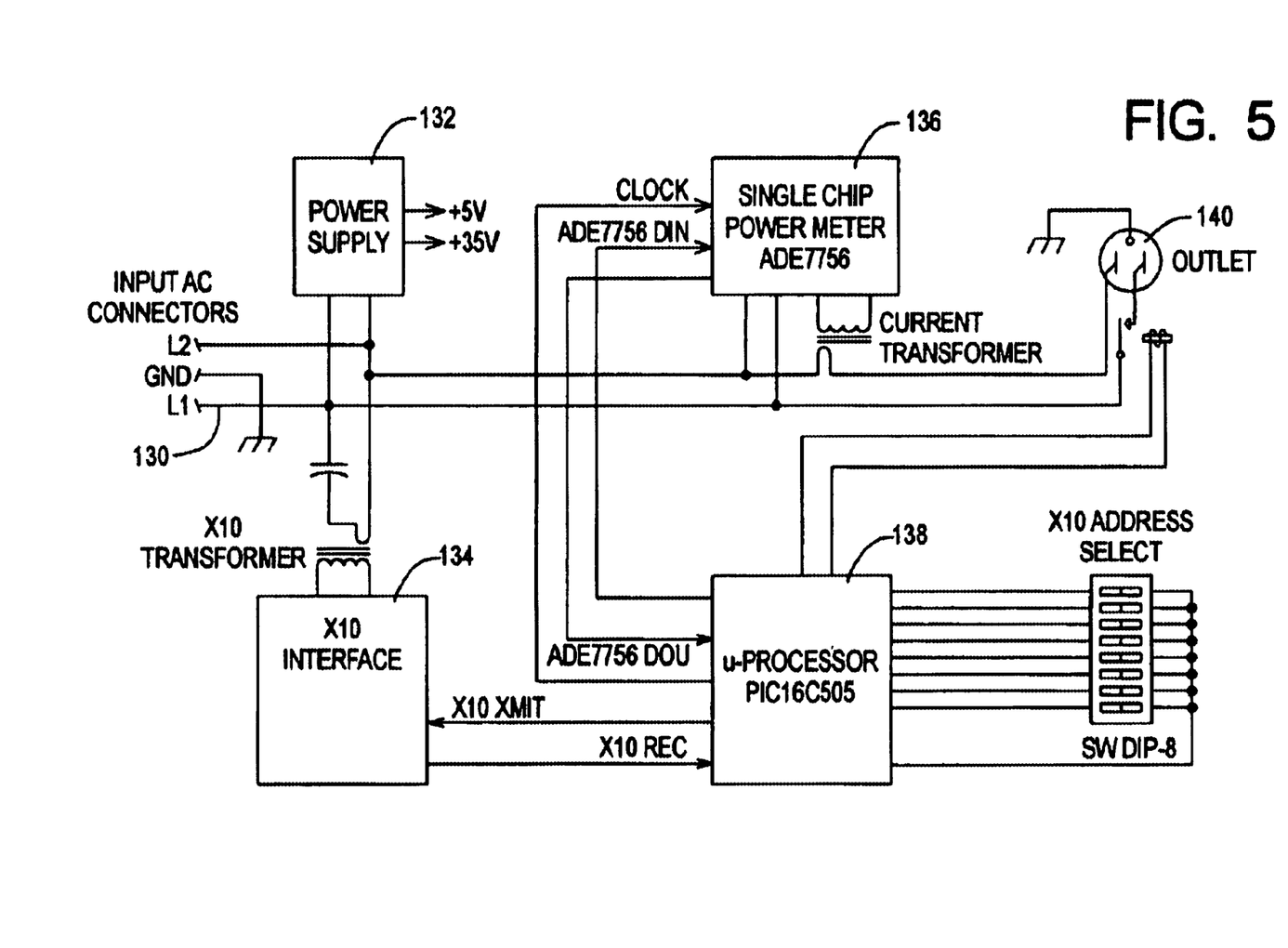
FIG. 5 shows schematically one of the monitoring/switching units.

FIGS. 3–5 show a third embodiment of the present invention which is substantially similar to the system of the second embodiment. But with the addition of more details in the design of the system. For convenience of description, there will be no attempt to carry-over the numerical designations of the second embodiment, and new numerical designations will be given, beginning with the numeral 100.

Reference is first made to FIG. 3 which shows the main components and functions of the system. At the left side of FIG. 3, there is what is called the "utility main frame" 100, which serves substantially the same functions as the "company" control system 84 shown in FIG. 2. The bi-directional pager link (which is called the "cell-phone" link previously) is indicated schematically in a circle in the top part of FIG. 3, and then the middle of FIG. 3, there is shown the "customer information box" 104 which would correspond in large part to the monitor control unit 76 of FIG. 2.

Then in the right-hand side of FIG. 3, there are shown three of the smart switches, which are called "smart outlet", these being designated 106. Some of the main functions that these main components are listed in FIG. 3, and these are the same.

The "utility mainframe" is the computer system for the power utility company. This is a high level system which collates all the data acquired by all customer data collection points. This includes data from customer power meters and their individual power monitors (the monitor/control units 76 of the second embodiment). This high level software provides real times to statistical reports on the power usage and potential power savings on an area-by-area basis. Ultimately, the data accumulated by this system will be used to bill the utility clients with all appropriate power credit information and control specific power outlets for power-using components (e.g. power use outlets for washers, refrigerators, television sets, outlets for lamps, etc.) in those geographical areas in which the utility wishes to manage. Actual service area maps can be generated to provide the power utility with energy numbers on an area basis. A sub-system of this computer will be the necessary hardware link to a "bi-directional pager link".

The bi-directional pager link 102 is that primary method to link all the utility customers into the utility's main data base. This will be done by using excess capacity in the existing bi-directional pager link systems. These systems provide the ability to gather information from all customer houses, as well as to write and communicate appliance control information through the "customer information box".

Reference will now be made FIG. 4 which shows the customer information box 104 in more detail. The customer information box 104 contains the following sub-systems: the thermal printer, the liquid crystal display (LCD), the power line communication interface (PLC1), the user keypad, the bi-directional pager link, the magnetic card reader, and the keypad. This customer information box 104 serves as the main link to the electric utility company computer 100 and also the customer's control and monitoring of individual electrical loads.

With further reference to FIG. 4, there is a plug 108 that plugs into a conventional 110 volt outlet and connects to the X10 offline power supply 110, to the logic power circuit 112, and to the X10 interface 112. The X10 offline power supply 110 rectifies the AC current and provides lower voltage DC output to supply power to the various components shown in FIG. 4. There is an X10 interface 112 which connects to the PLC16C505 processor 114. This PLC16C505 processor provides the X10 PLC1 protocol drive and communicates with the main Temic 8051 processor 116 through an isolated opto-coupler link 118.

The 8051 processor 116 in turn has operative connections with the pager interface 117 ("cell-phone") interface, the POTS interface 118 (telephone connection), the magnetic card reader 120 (e.g. for reading a person's credit card when a payment is being made), the printer 122, and printer driver/interface 124 (e.g. to print out communications, bills, receipts, charges, etc.), the liquid crystal display 126 (e.g. displaying various information communicated from the power company or otherwise developed or obtained), and the keypad 128. Thus, this Temic 8051 processor interfaces to and drives the other systems mentioned above.

The pair of processors (8051/PLC16C505) constantly interrogate the customer's monitoring/switching units (66 and 72 in FIG. 2) via the PLC1 for the individual control of the various electrical outlets in the customer's home. The customer is then able to view the current status of power consumption of his home and determine whether or not he wishes to participate in any coming power conservation campaign. The queries through the liquid crystal-display 126 (LCD) and responses via the keypad 128 allow the users (homeowners) to be communicate back to the utility via the bi-directional pager link 117 and through the telephone line via the POTS interface 118. Also, as indicated above, the customer information box allows the utility company to send other messages or money saving opportunities to the utility customers that are not just related to the energy business.

Reference is now made to FIG. 5 which shows in more detail one of the smart power outlets 106 of FIG. 3 (which correspond to the monitoring/switching units 66 and 72 of FIG. 2). At the left side of FIG. 5, there is the plug connection 130. As indicated previously, this plug 130 could connect to the conventional existing electric outlet, in which case the smart power outlet 106 would have its own plug 130 to fit into the existing power outlet, and also its own socket or other outlet fitting to connect to the plug of an electric appliance, a lamp, television, etc., or the smart power outlet 106 could simply replace the existing electric outlet. In either case, the basic structure shown in FIG. 5 remains the same, In FIG. 5, there is the power supply 132 which rectifies the DC current and provides a lower voltage DC output. Further, there is the X10 interface 134 which communicates with the X10 interface 112 of the customer information box.

At the upper page of Page 2, there is a single chip power meter ADE7756, which monitors the current flowing through the two wires and sends this information to the processor 138 (PLC16C505) which in turn sends this to the X10 interface 134. From the X10 interface 134, the information is sent to the customer information box 104. Also, the X10 interface 134 receives instructions over the power lines from the customer information box 104 and transmits this to the processor 138, which in turn translates this into a signal to open or close a relay to control the flow of current through the power lines. At the lower right-hand corner portion of FIG. 5, there Is the "XL address select" component through which the customer information box 104 communicates with its related smart chip modules 106.

Also, in FIG. 3 there is shown a monitoring/switching unit 106a which connects to the main power lines which are entering the home or other facility at 107. By means of this smart outlet component 106a, the total current flowing into the house can be monitored, and can also be shut off if a particular situation warrants this.

It is to be understood, that various modifications could be made without departing from the basic teachings of the present invention. Also, the terminology which is used to describe various components and functions is to be interpreted to include other components, entities, or functions that do not literally fall within the terminology used. For example, the term "electric utility" could refer to some provider of power which would not necessarily be a "utility". Also, the term "house" or home which refers to the home or dwelling of the user, could also include some other end user, such as an office building, a commercial establishment, etc.

Also, it is to be understood that various modifications could be made to the present invention without departing from the basic teachings thereof.

I claim:

1. A system to monitor and control power usage where:
   a) there is a power provider which provides power to a plurality of power user facilities in an operating area of the power provider;
   b) a plurality of participating power user facilities each having a facility power distribution network which comprises a main power receiving connection to receive power from the power provider and deliver power to a plurality of outlet locations of the participating power user facility; and,
   c) there are at least at some of said outlet locations power using components to receive power from its facility power distribution network at such power locations; said system comprising:
   a) each of said participating facilities having a plurality of monitoring/switching units, each of which has an operative connection to the power distribution network for a related outlet location, and being arranged to receive control signals to stop or permit current flow from its related location outlet, each monitoring/switching unit also being arranged to monitor current flow from its related outlet location and to transmit information signal(s) related to said current flow;
   b) a power provider control section arranged to transmit provider control signals to of each participating facility to selectively stop current flow or permit current flow at one or more selected outlet locations, and to receive information from each participating facility relating to electric power usage in the participating power user facility.
   c) each of said participating facilities having a monitoring/control section having operative connections to said monitoring/switching units and to said power provider control section said monitoring/control section being arranged to be able to:
      i. to receive information relating to current flow at each of said monitoring switching units:
      ii. to present at said monitoring control section said information relating to current flow at each monitoring/switching unit so as to be selectively observable at said monitoring/control section relative power usage and time periods of usage;

iii. to communicate with said power provider control section to acquire information relating to power delivered and/or to be delivered at the participating facility in a manner that the information from the power provider control section is observable at the participating facility;

iv. to be able to be operated to initiate at each of said monitoring control section control signals relating to initiating and terminating periods during which current is to be delivered to selected monitoring/switching units.

2. The system as recited in claim 1, wherein said power provider control section and said facility monitoring/control section transmit and receive signal between one another by way of electromagnetic wave communication, telephone communication, or a combination of electromagnetic wave communication and telephone communication.

3. The system as recited in claim 1, wherein said power provider control section and said facility monitoring/control section, send and receive signals between one another by electromagnetic communication.

4. The system as recited in claim 1, wherein said power provider control section and said facility monitoring/control section, send and receive signals between one another by telephone communication.

5. The system as recited in claim 1, wherein said monitoring/switching units and the facility monitoring/control section exchange and receive signal between one another by communicating over the power distribution network of the facility.

6. The system as recited in claim 1, wherein said monitoring/switching units and the facility monitoring/control section exchange and receive signal (s) between said power provider control sections and said monitoring/control sections to establish a structure for "Pre-Paid" power consumption by having the consumer pre pay for "Consumer Power Credits" (CPC) for the purchase of known amount of power at a known price per kilowatt.

7. The system as recited in claim 1, wherein said monitoring/switching units and the facility monitoring/control section exchange and receive signal (s) between one another by communicating over the fiber optic cables using Ethernet technology.

8. The system as recited in claim 1, wherein said monitoring/control section comprises a monitoring control unit and an information output unit to initiate communication with said power providing control section to initiate signals to said monitoring/switching units relative to stopping and permitting current to said monitoring/switching units.

9. The system as recited in claim 8, wherein said power providing control section causes power to be delivered to said monitoring/switching units in accordance with a prearrangement as to which outlet locations at the participating facility has power curtailed for a period of time and said information output unit is able to by-pass and/or restructure said prearrangement of current flow being permitted or stopped.

10. The system as recited in claim 8, wherein said information output unit comprises a keyboard.

11. The system as recited in claim 9, wherein said information output unit comprises a keyboard.

12. The system as recited in claim 1, wherein said monitoring control section comprises a monitoring/control unit and a visual communication unit to display information transmitted to said monitoring/control unit.

13. The system as recited in claim 12, wherein said visual communication unit comprises a visual display, or a printer, or both a visual display and a printer.

14. The system as recited claim 8, wherein the power provider control section comprises a computer program arranged to cause control signals to be transmitted to said participating facility in accordance with a pre-arrangement, and said information output unit is arranged to be able to modify said program in accordance with instructions from said information output unit of the monitoring control section of that participating facility.

15. The system as recited in claim 8, wherein said information output unit comprises a keyboard arranged to request information from said power providing control section and to request data from said monitoring/switching units and to initiate communications for modifying a computer program at said power providing control section to modify said program in accordance with instructions initiated from said monitoring/control section at the participating facility.

16. The system as recited in claim 1, wherein at least some of said participating facilities is able to terminate its participation in the system by deactivating communication with the power provider control section and causing all of the monitoring switching units in that facility to go to or remain at a current transmitting mode of operation.

17. The system as recited in claim 1, wherein the monitoring/control section has a information receiving capability to receive information from the power providing control system and providing an alert signal for the monitoring/control section.

18. The system as recited in claim 17, wherein said alert signal comprises an audio signal, or a visual signal, or both an audible and visual signal.

19. The system as recited in claim 18, wherein said monitoring/control section comprises a credit card reading unit by which payment of power bills and/or other financial related transactions can be initiated through a communication channel between said monitoring/control section and the power providing control section.

20. The system as recited in claim 1, wherein said monitoring/control section communicates through electric power lines in the facility to communicate with the monitoring switching units in the participating facility.

* * * * *